US012740178B2

(12) United States Patent
Veirman et al.

(10) Patent No.: US 12,740,178 B2
(45) Date of Patent: Sep. 15, 2026

(54) METHOD FOR TREATING A PHOTOVOLTAIC MODULE BY LIGHT SOAKING

(71) Applicant: COMMISSARIAT A L'ENERGIE ATOMIQUE ET AUX ENERGIES ALTERNATIVES, Paris (FR)

(72) Inventors: Jordi Veirman, Grenoble Cedex (FR); Tristan Gageot, Grenoble Cedex (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 18/877,532

(22) PCT Filed: Jun. 19, 2023

(86) PCT No.: PCT/EP2023/066484
§ 371 (c)(1),
(2) Date: Dec. 20, 2024

(87) PCT Pub. No.: WO2023/247451
PCT Pub. Date: Dec. 28, 2023

(65) Prior Publication Data

US 2025/0374705 A1 Dec. 4, 2025

(30) Foreign Application Priority Data

Jun. 20, 2022 (FR) ........................................ 2206003

(51) Int. Cl.
*H10F 71/00* (2025.01)
*H10F 10/166* (2025.01)
(Continued)

(52) U.S. Cl.
CPC ......... *H10F 71/128* (2025.01); *H10F 10/166* (2025.01); *H10F 71/103* (2025.01); *H10F 77/1668* (2025.01)

(58) Field of Classification Search
CPC .. H10F 71/103; H10F 71/128; H10F 77/1668; H10F 10/166
See application file for complete search history.

(56) References Cited

U.S. PATENT DOCUMENTS

| | | | |
|---|---|---|---|
| 10,505,069 B2 | 12/2019 | Hallam et al. | |
| 2013/0306140 A1* | 11/2013 | Edmonson | H10F 71/128 136/252 |

FOREIGN PATENT DOCUMENTS

| | | |
|---|---|---|
| CN | 110416357 A | 11/2019 |
| FR | 3 113 190 A1 | 2/2022 |

(Continued)

OTHER PUBLICATIONS

Machine translation of CN110416357 A, Zhou Jian. (Year: 2019).*
(Continued)

*Primary Examiner* — Mayla Gonzalez Ramos
(74) *Attorney, Agent, or Firm* — CUSHMAN PARTNERS, LLC

(57) ABSTRACT

A method for treating a photovoltaic module, the method including in succession a first procedure of exposing at least one photovoltaic cell of the photovoltaic module to electromagnetic radiation, during which the temperature of the photovoltaic cell increases until reaching a temperature, referred to as performance enhancement temperature, that is greater than or equal to 100° C.; a second procedure of exposing the photovoltaic cell to electromagnetic radiation, during which the temperature of the photovoltaic cell is maintained between $T_s$−5° C. and $T_s$+5° C., where $T_s$ is the performance enhancement temperature, the second exposure procedure having a duration greater than or equal to 5 s; and
(Continued)

a procedure of cooling the photovoltaic cell until a temperature of less than 100° C. is reached.

20 Claims, 4 Drawing Sheets

(51) Int. Cl.

| | |
|---|---|
| ***H10F 71/10*** | (2025.01) |
| ***H10F 77/166*** | (2025.01) |

(56) References Cited

FOREIGN PATENT DOCUMENTS

| | | |
|---|---|---|
| WO | WO 2020/082131 A1 | 4/2020 |
| WO | WO 2021/018757 A1 | 2/2021 |

OTHER PUBLICATIONS

International Search Report as issued in International Patent Application No. PCT/EP2023/066484, dated Sep. 19, 2023.

Cattin, J., et al., "Transferability of the light-soaking benefits on silicon heterojunction cells to modules," arXiv e-prints, (Year: 2021), p. arXiv: 2107.00293.

Kobayashi, E. et al., "Increasing the efficiency of silicon heterojunction solar cells and modules by light soaking," Solar Energy Materials and Solar Cells, (Year: 2017), http://dx.doi.org/10.1016/j.solmat.2017.06.023.

* cited by examiner

METHOD FOR TREATING A PHOTOVOLTAIC MODULE BY LIGHT SOAKING

CROSS-REFERENCE TO RELATED APPLICATIONS

This application is the U.S. National Stage of PCT/EP2023/066484, filed Jun. 19, 2023, which in turn claims priority to French patent application number 2206003 filed Jun. 20, 2022. The content of these applications are incorporated herein by reference in their entireties.

TECHNICAL FIELD OF THE INVENTION

This invention relates to a method for treating a photovoltaic module comprising a plurality of photovoltaic cells, in order to improve and stabilise efficiency of the photovoltaic cells, and consequently electrical performance of the photovoltaic module.

TECHNOLOGICAL BACKGROUND OF THE INVENTION

FIG. 1 represents an example of a silicon heterojunction (SHJ) photovoltaic cell 10. The photovoltaic cell 10 comprises a doped crystalline silicon substrate 11 and two amorphous silicon layers 12-13 disposed on either side of the substrate 11. One of the amorphous silicon layers 12-13 is doped with the same type of conductivity as the substrate 11, for example n-type, and the other layer is doped with the opposite type of conductivity, i.e. p-type.

The heterojunction is formed by the n-doped crystalline silicon substrate 11 and the p-doped amorphous silicon layer, this layer forming the emitter of the photovoltaic cell. The emitter can be located on the front or rear face of the photovoltaic cell.

The photovoltaic cell SHJ is particularly sensitive to defects located at the interface between the crystalline silicon substrate 11 and the amorphous silicon layers 12-13. These defects can be dangling bonds or impurities such as metal ions. They introduce energy levels into the band gap of silicon and increase the number of electron-hole recombinations at the interfaces, which deteriorates output parameters of the photovoltaic cell, such as the open circuit voltage Voc.

To obtain a high-performance photovoltaic cell, it is therefore necessary to minimise the number of recombinations on the surface of the substrate 11, which is generally carried out by depositing a passivation layer 14 of intrinsic hydrogenated amorphous silicon onto each of the faces of the substrate 11, before the amorphous silicon layer 12, 13. Hydrogen atoms contained in the passivation layers 14 diffuse to the surface of the substrate 11 and neutralise defects.

Each of the amorphous silicon layers 12-13 is additionally covered with a layer of Transparent Conductive Oxide (TCO) 15, then by collecting electrodes 16, commonly referred to as metallisations.

Photovoltaic cells SHJ are known to improve their energy conversion efficiency by about 0.3% absolute under the combined effect of lighting and temperature. This so-called cell enhancement phenomenon results from the improvement of at least one of the hydrogenated amorphous silicon passivation layers 14, the improvement of the TCO layers 15 as well as the improvement of the interfaces between the TCO layers 15 and the metallisations 16.

The observation of the enhancement phenomenon of SHJ photovoltaic cells has led to the development of treatment methods comprising a step of exposing the photovoltaic cells to a light flux. These methods are commonly referred to as light-soaking treatment methods.

In paper ["Transferability of the light-soaking benefits on silicon heterojunction cells to modules", arXiv e-prints, 2021, p. arXiv: 2107.00293], J. Cattin et al. teach that the efficiency gain of photovoltaic cells SHJ subjected to a light-soaking treatment method can be partly lost upon manufacturing the photovoltaic module, and more particularly during the lamination step. They also notice that a treatment method conducted on the scale of the photovoltaic module results in an efficiency gain similar to that obtained with bare photovoltaic cells. They conclude that a single treatment on the scale of the photovoltaic module could prove sufficient.

Treating a photovoltaic module can prove more advantageous than treating bare photovoltaic cells in terms of throughput, as the photovoltaic cells in the module (usually 72 or 144 in number) are simultaneously exposed to the light flux.

Finally, document WO 2021018757 A1 describes a method for treating a photovoltaic module comprising at least two SHJ photovoltaic cells electrically connected together. Each SHJ cell comprises an n-type doped crystalline silicon substrate and a hydrogenated amorphous silicon passivation layer disposed on one face of the substrate. The treatment method comprises a step of exposing the SHJ cells to electromagnetic radiation having a high irradiance, typically greater than or equal to 200 $kW/m^2$.

The duration of the treatment with such irradiance has to be very short, typically less than 12 s, to avoid damaging the photovoltaic module due to excessive heating. Unless it is carried out several times in succession, which is time-consuming (cooling phases between exposures) and restrictive, this treatment method does not allow the maximum efficiency gain to be achieved.

SUMMARY OF THE INVENTION

There is therefore a need to provide a method for treating a photovoltaic module by light-soaking that provides better control of the amplitude of the photovoltaic cell efficiency gain.

According to a first aspect of the invention, this need tends to be satisfied by providing a method for treating a photovoltaic module comprising a plurality of photovoltaic cells coated with an encapsulating material and disposed between two protective plates, said method successively comprising:

- a first step of exposing at least one photovoltaic cell of the photovoltaic module to electromagnetic radiation, during which the temperature of said at least one photovoltaic cell increases until it reaches a temperature referred to as the efficiency enhancement temperature, greater than or equal to 100° C.;
- a second step of exposing said at least one photovoltaic cell to electromagnetic radiation, during which the temperature of said at least one photovoltaic cell is maintained between $T_s$−5° C. and $T_s$+5° C., where $T_s$ is the efficiency enhancement temperature, the second exposure step having a duration greater than or equal to 5 s, preferably greater than or equal to 10 s;
- a step of cooling said at least one photovoltaic cell to a temperature below 100° C.

The second exposure step, carried out around the enhancement temperature, improves the efficiency gain of cells at a high rate (referred to as efficiency gain kinetics) and furthermore allows easy control of the amplitude of the efficiency gain, as its duration can be adjusted on the basis of the targeted efficiency gain.

Further to the characteristics just discussed in the preceding paragraph, the treatment method according to the first aspect of the invention may have one or more additional characteristics from among the following, considered individually or according to any technically possible combinations:

- the first exposure step is carried out under conditions such that the temperature of said at least one photovoltaic cell increases at a rate greater than or equal to 1° $C.\cdot s^{-1}$, preferably greater than or equal to 2° $C.\cdot s^{-1}$;
- said at least one photovoltaic cell is cooled by thermal conduction during the cooling step by means of a temperature-controlled support or by forced convection;
- the step of cooling said at least one photovoltaic cell is carried out under conditions such that the temperature of said at least one photovoltaic cell decreases at a rate greater than or equal to 1° $C.\cdot s^{-1}$, preferably greater than or equal to 2° $C.\cdot s^{-1}$;
- said at least one photovoltaic cell is exposed to electromagnetic radiation during the cooling step, the electromagnetic radiation having an irradiance of less than 1000 $W/m^2$ during the cooling step;
- the electromagnetic radiation has a first irradiance greater than or equal to 3 $kW/m^2$ during the first exposure step, preferably greater than or equal to 10 $kW/m^2$;
- the first irradiance is constant;
- the electromagnetic radiation has a second irradiance during the second exposure step, the second irradiance being less than or equal to the first irradiance;
- the second irradiance is reduced during the second exposure step, preferably in steps;
- the second exposure phase comprises several successive periods, the electromagnetic radiation has a constant irradiance during each period and decreasing between the periods;
- several photovoltaic cells of the photovoltaic module are simultaneously exposed in the first and second exposure steps, and then simultaneously cooled in the cooling step;
- the second exposure step is immediately consecutive to the first exposure step;
- the photovoltaic cells are silicon heterojunction cells; and
- each of the photovoltaic cells comprises a crystalline silicon substrate and at least one hydrogenated amorphous silicon passivation layer disposed on one face of the crystalline silicon.

A second aspect of the invention relates to an equipment for the treatment of a photovoltaic module by light-soaking, comprising an electromagnetic radiation source, a cooling system and means configured to implement a treatment method according to the first aspect of the invention.

Further to the characteristics just discussed in the preceding paragraph, the equipment according to the second aspect of the invention may have one or more additional characteristics from among the following, considered individually or according to any technically possible combinations:

- the equipment further comprises a support translationally movable relative to the radiation source and configured to transport several photovoltaic modules simultaneously;
- the equipment further comprises a control circuit configured to modulate at least one parameter of the cooling system and/or irradiance of the electromagnetic radiation as a function of the temperature of said at least one photovoltaic cell;
- the equipment further comprises a control circuit configured to modulate at least one parameter of the cooling system and/or irradiance of the electromagnetic radiation as a function of a predetermined profile;
- the cooling system comprises a plurality of nozzles capable of blowing air towards the photovoltaic module;
- the plurality of nozzles comprising a first group of nozzles oriented in a first direction and a second group of nozzles oriented in a second direction different from the first direction, the nozzles of the first group being directed towards a location of the photovoltaic module intended to carry out the second exposure step and the nozzles of the second group being directed towards a location of the photovoltaic module intended to carry out the cooling step; and
- the radiation source is dimensioned to irradiate the photovoltaic module entirely.

BRIEF DESCRIPTION OF THE FIGURES

Other characteristics and advantages of the invention will become clearer from the description thereof given below, by way of indicating and in no way limiting purposes, with reference to the following figures.

For greater clarity, identical or similar elements are identified by identical reference signs throughout the figures.

DETAILED DESCRIPTION

Figure 2:
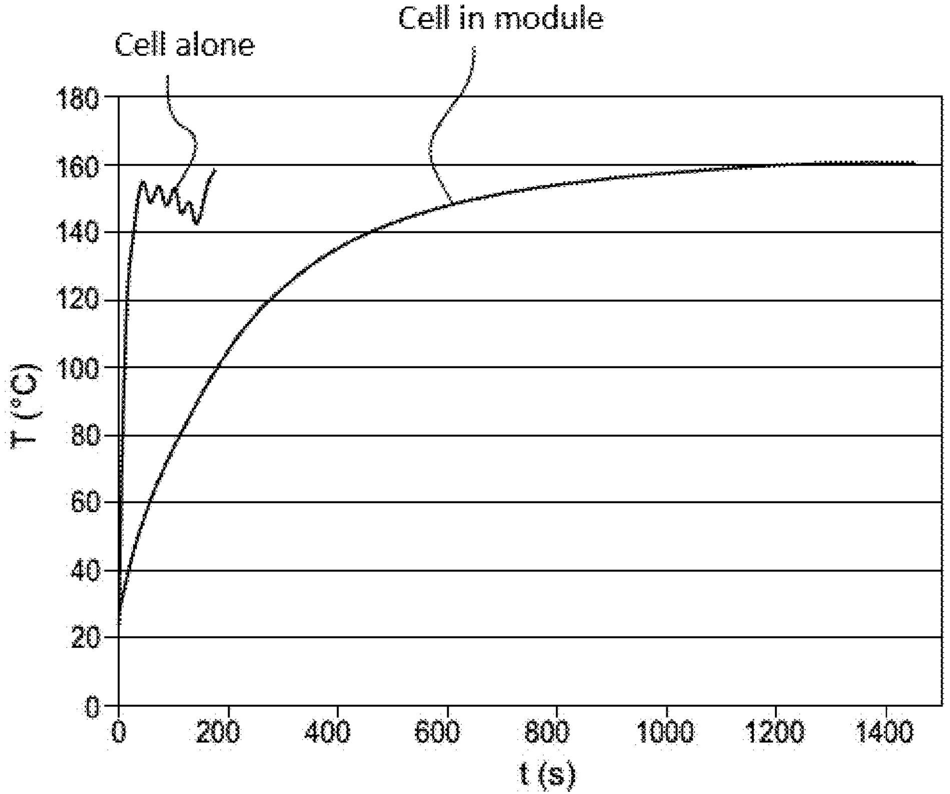
FIG. 2 represents heating-up of a bare photovoltaic cell and a photovoltaic cell within a photovoltaic module during a constant irradiance treatment.

FIG. 2 represents the evolution of temperature T of a bare photovoltaic cell and a photovoltaic cell within a photovoltaic module, during an experimental treatment method by light-soaking. The photovoltaic cell within the photovoltaic module is coated with an encapsulating material (in this case two 650 μm thick sheets of a polymeric material similar to EVA, marketed by MITSUI CHEMICALS AMERICA, INC under the reference SOLAR EVA™) and disposed between two protective plates (here a tempered glass plate and a multilayer backsheet marketed by the company dnpSolar under the reference PV-BS VAPEW), unlike the bare photovoltaic cell. The light-soaking treatment is carried out under the same conditions for both photovoltaic cells: the photovoltaic cells are exposed to electromagnetic radiation with an irradiance equal to 2 kW/m$^2$. The radiation source is a halogen lamp. Both photovoltaic cells are identical (rear face emitter n-type SHJ cells) and the temperature T is measured at the same place for both cells.

This figure shows that the temperature of the photovoltaic cell within the module increases much more slowly than the temperature of the bare photovoltaic cell. This result may be counter-intuitive in that the photovoltaic cell in the module is surrounded by thermally insulating materials: the encapsulating material and the material(s) of the protective plates. It might therefore be expected that heat generated by the cell (by absorbing electromagnetic radiation) is more difficult to evacuate within the module than in the case of a bare cell, resulting in a more rapid rise in temperature. In reality, the slow rise in temperature of the cell within the module is explained by the fact that the other components of the module, namely the encapsulating material around the cell and the protective plates, delay the rise in temperature of the cell, by absorbing heat generated by the cell. Indeed, heat diffuses by conduction to the encapsulating material and then to the protective plates. In other words, the other components of the module act as thermal buffers.

Light-soaking treatment improves efficiency of a photovoltaic cell at an acceptable rate (from an industrialisation point of view) only when it reaches a high temperature, in the order of 100° C. The slow temperature rise of the photovoltaic cell within a module is therefore a handicap when it comes to obtaining a short treatment time compatible with productivity requirements of the photovoltaic industry.

With this in mind, the inventors have developed a method for treating a photovoltaic module that reconciles treatment time (compatible with productivity requirements) with control of the amplitude of the efficiency gain.

Conventionally, a photovoltaic module comprises several photovoltaic cells electrically connected together (to form one or more strings of cells). These photovoltaic cells are coated with an encapsulating material, typically a polymeric material such as ethylene vinyl acetate (EVA), and disposed between two protective plates, also referred to as support plates. The protective plates form the front and rear faces of the photovoltaic module. The protective plates can be made of glass, a polymeric material or a composite material. They can be single-layer or multi-layer, like the backsheet usually used on the rear face.

One of the protective plates (that forming the front face) is made of a material transparent to solar radiation (and to the electromagnetic radiation emitted during the treatment method), for example glass. In the case of bifacial photovoltaic cells, the other protective plate (that forming the rear face) is also made of a material transparent to solar radiation (e.g. glass). In the case of monofacial photovoltaic cells, the other protective plate can be made of a material that is opaque to solar radiation. Of course, the encapsulating material is also transparent to solar radiation.

The method for treating a photovoltaic module according to the invention comprises exposing at least one part of the photovoltaic module to electromagnetic radiation, with the aim of improving efficiency of a photovoltaic cell or of a group of photovoltaic cells. In the following description, the most advantageous case in terms of productivity will be considered: that of treating a group of photovoltaic cells (i.e. several photovoltaic cells simultaneously). A group of photovoltaic cells comprises between 2 and N photovoltaic cells, N being the total number of photovoltaic cells in the module (for example equal to 72 or 144).

Electromagnetic radiation is emitted by a radiation source in the direction of the photovoltaic module. It passes through one of the protective plates and the encapsulating material, and is then absorbed by the photovoltaic cells in the module. The radiation source is a device capable of emitting electromagnetic radiation with an irradiance greater than or equal to 3 kW/m$^2$, preferably greater than or equal to 10 kW/m$^2$. Irradiance, also referred to as flux of radiation or light power density per unit area, represents the power of electromagnetic radiation received by a unit area, this unit area being oriented perpendicularly to the direction of the electromagnetic radiation. The electromagnetic radiation is preferably directed perpendicularly to the surface of the photovoltaic module.

The electromagnetic radiation may be monochromatic, i.e. have a single wavelength, or polychromatic, i.e. include several (monochromatic) components of different wavelengths. Preferably, the electromagnetic radiation has at least one wavelength between 300 nm and 1100 nm, preferably between 400 nm and 1100 nm, and advantageously between 800 nm and 1000 nm.

Figure 3:
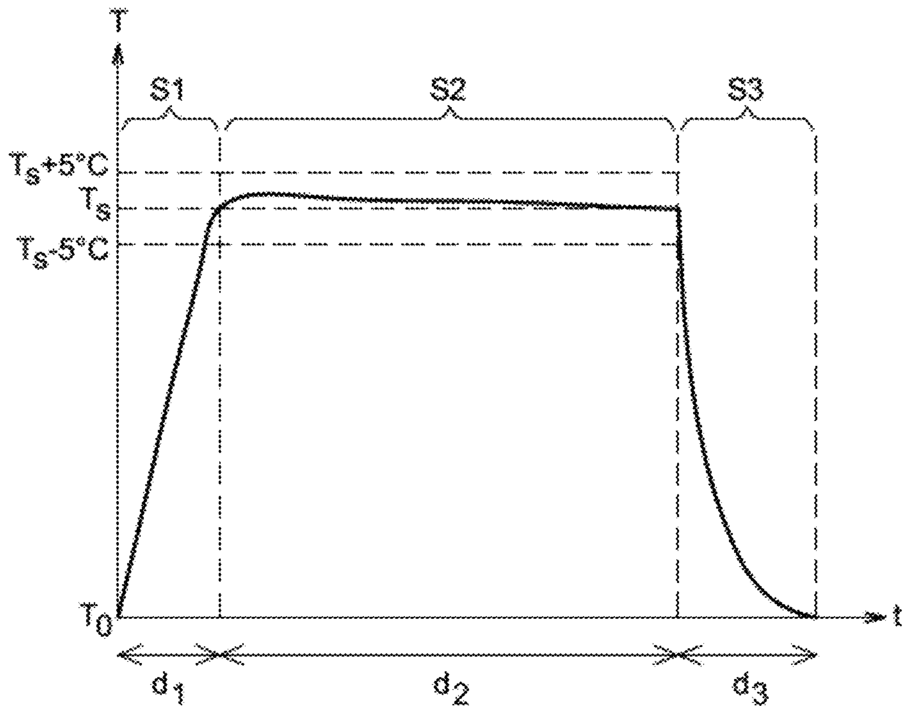
FIG. 3 represents the temperature of a group of photovoltaic cells belonging to a photovoltaic module during a treatment method according to the invention.

FIG. 3 is a graph of the temperature T of the group of photovoltaic cells as a function of time t, illustrating the photovoltaic module treatment method. The temperature T can be measured using a K-type thermocouple placed between one of the photovoltaic cells of the group and the encapsulating material.

The treatment method comprises three successive steps (or phases):

- a first step S1 of exposing the group of photovoltaic cells to electromagnetic radiation, during which the temperature T of the photovoltaic cells of the group increases until it reaches a temperature $T_s$, referred to as the efficiency enhancement temperature;
- a second step S2 of exposing the group of photovoltaic cells to electromagnetic radiation, during which the temperature T of the photovoltaic cells of the group is maintained between $T_s-5°$ C. and $T_s+5°$ C.; and
- a step S3 of cooling the group of photovoltaic cells, during which the temperature T of the photovoltaic cells of the group decreases until it reaches a temperature below 100° C., for example room temperature (25° C.).

The enhancement temperature $T_s$ is greater than or equal to 100° C., which is the temperature at which efficiency of photovoltaic cells begins to improve at a rate compatible with productivity requirements.

The enhancement temperature $T_s$ is further selected to be at least 5° C. lower than a threshold temperature $T_{max}$ above which the photovoltaic module is likely to be degraded ($T_s \leq T_{max}-5°$ C.). This threshold temperature $T_{max}$ (also referred to as the photovoltaic module degradation temperature) depends on materials making up the photovoltaic module.

Generally speaking, the threshold temperature $T_{max}$ is imposed by the encapsulating material or the technique used to interconnect photovoltaic cells of the module. In other words, the threshold temperature $T_{max}$ is equal to the lowest of the maximum temperatures permitted by the encapsulating material and interconnections. According to the type of encapsulating material (cross-linkable or thermosetting) and the nature of interconnections (welding by means of low-temperature alloys such as SnBiAg or SnPbAg, electrically conductive adhesive, etc.), the threshold temperature $T_{max}$ can be between 120° C. and 220° C. The threshold temperature $T_{max}$ of a photovoltaic module can be determined in several ways. I-V measurements or reliability tests (UV, DH, TC) of the module may show poorer performance (e.g. degraded efficiency) above a temperature. Opacification or yellowing of the encapsulating material may also be noticed with the naked eye or via reflectivity measurements above a temperature. Delamination or peeling of the interconnections may also occur and be visible to the naked eye.

Thus, the enhancement temperature $T_s$ can be between 100° C. (the temperature at which the treatment becomes effective) and 215° C. (the maximum value of the threshold temperature $T_{max}$ minus 5° C.).

The aim of the first exposure step S1 is to heat the group of photovoltaic cells rapidly, in order to reach the enhancement temperature $T_s$ in a very short period of time and thus shorten the overall treatment duration. The first exposure step S1 is advantageously carried out so that the temperature T of the cells increases at a rate greater than or equal to 1° C.·$s^{-1}$, preferably greater than or equal to 2° C.·$s^{-1}$.

The first exposure step S1 has a first duration $d_1$ which can be between 3 s and 180 s, preferably between 5 s and 20 s.

The initial temperature $T_0$ of the photovoltaic cells, i.e. the temperature at the start of the first exposure step S1 (i.e. t=0), may be room temperature (25° C.) or a temperature higher than room temperature. For example, the treatment method can be carried out immediately after the step of laminating the photovoltaic cells between sheets of encapsulating material and the protective plates. This step is generally carried out at a temperature of between 80° C. and 160° C. to soften the encapsulating material. In other words, the initial temperature $T_0$ of the photovoltaic cells can be equal to the lamination temperature, between 80° C. and 160° C. The higher the initial temperature $T_0$ of the photovoltaic cells, the shorter the first duration $d_1$ can be.

During the first exposure step S1, the electromagnetic radiation has a first irradiance $E_1$ which is advantageously greater than or equal to 3 kW/$m^2$, even more advantageously greater than or equal to 10 kW/$m^2$, and preferably between 30 kW/$m^2$ and 100 kW/$m^2$. Selecting a high irradiance value is a simple solution for rapidly increasing temperature T of the photovoltaic cells during the first exposure step S1. The first irradiance $E_1$ is preferably constant throughout the first duration $d_1$ of the first exposure step S1.

The second exposure step S2, also referred to as the temperature maintenance step, enables the desired efficiency gain to be achieved without the risk of degrading the photovoltaic module (since the temperature remains substantially equal to the enhancement temperature $T_s$). It has a second duration $d_2$ which can be easily adjusted on the basis of the desired efficiency gain. Typically, the second duration $d_2$ is greater than or equal to 5 s, preferably greater than or equal to 10 s.

The closer the enhancement temperature $T_s$ is to the threshold temperature $T_{max}$, the greater the efficiency gain kinetics. Thus, to maximise the efficiency gain kinetics (and thus reduce the total treatment duration), the enhancement temperature $T_s$ is advantageously selected between [$T_{max}$−20° C.] and [$T_{max}$−5° C.].

In contrast to a method used to treat a photovoltaic cell alone, maintaining the photovoltaic module at the temperature $T_s$ (also referred to as the stationary temperature) means that the treatment conditions have to change during the second exposure step S2. Indeed, the thermal buffer phenomenon described previously becomes less and less effective with exposure time, as the encapsulating material and the protective plates gradually heat up. In other words, there is less and less heat transfer from the photovoltaic cells to the other components of the module. Consequently, if treatment conditions remain unchanged, the temperature T of the photovoltaic cells (and therefore of the interconnections and the encapsulating material) will gradually increase, until the photovoltaic module is irreparably damaged.

In order to keep a temperature T of the photovoltaic cells substantially constant, it may be contemplated to actively cool the photovoltaic module during the second exposure step S2, in order to restore effectiveness of the thermal buffer phenomenon.

Active cooling can be achieved by forced convection, for example by blowing air onto the photovoltaic module. The blowing speed and/or the temperature of the blown air are adapted during the second exposure step S2 so as to compensate for the massive influx of heat into the encapsulating material and the protective plates. Active cooling can also be achieved by bringing the module into contact with a temperature-controlled support (preferably a metal plate). The temperature of the support is reduced as the second exposure step S2 progresses.

During the second exposure step S2, the electromagnetic radiation may have a second irradiance $E_2$ which is equal to the first irradiance $E_1$.

Another possibility, which can be combined with active cooling, is to reduce irradiance of the electromagnetic radiation in order to compensate for the fact that the encapsulating material and the protective plates gradually heat up. The second irradiance $E_2$ is then (strictly) lower than the first irradiance $E_1$.

The second irradiance $E_2$ is preferably reduced in steps during the second exposure step S2. The second exposure step S2 then comprises several successive periods, the electromagnetic radiation having an irradiance constant during each period and decreasing between the periods.

The second exposure step S2 can be immediately consecutive to the first exposure step S1, as is represented by FIG. 3. In other words, the second exposure step S2 starts at the moment when the first exposure step S1 ends. There is then no interruption in exposure to the electromagnetic radiation.

Figure 4:
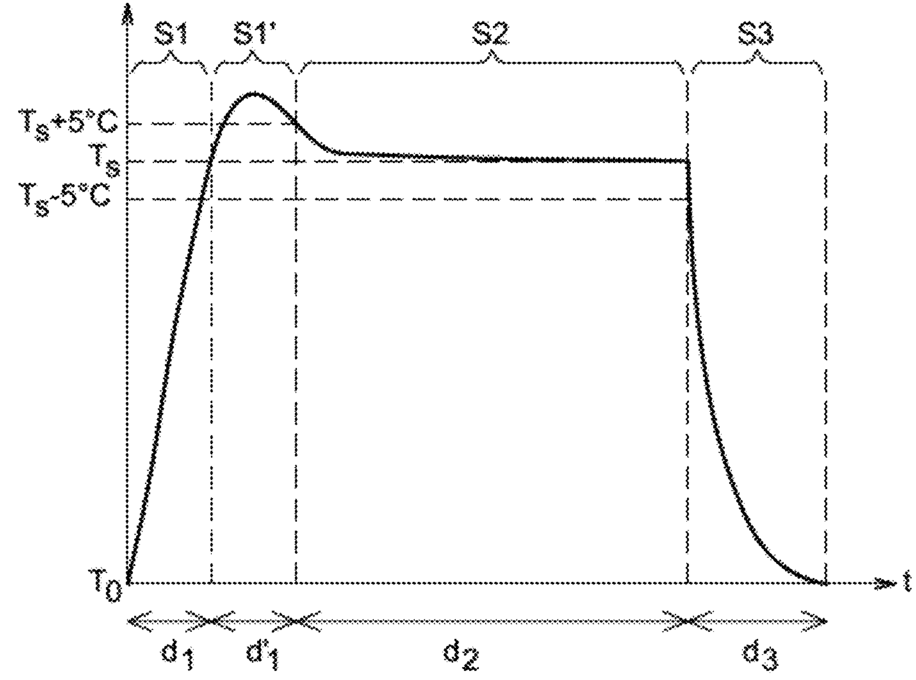
FIG. 4 represents the temperature of a group of photovoltaic cells belonging to a photovoltaic module during one alternative to the treatment method according to the invention.

With reference to FIG. 4, the second exposure step S2 may be separated from the first exposure step S1 by a so-called stabilisation phase S1', during which the temperature of the photovoltaic cells (briefly) exceeds the temperature [$T_s$+5° C.]. This stabilisation phase S1' may correspond to the period of time needed for the other components (encapsulating material and protective plates) of the module to absorb the excess heat generated by the photovoltaic cells (and for the cooling system to produce its full effects, if necessary).

Since it lasts for a very short duration $d_1'$, typically less than 10 s, and preferably less than 5 s, the stabilisation phase S1' does not damage components of the photovoltaic module if the temperature T of the photovoltaic cells becomes greater than the threshold temperature $T_{max}$.

The photovoltaic cells are advantageously exposed to the electromagnetic radiation during the stabilisation phase S1', in order to continue to improve efficiency during this period of time and ultimately shorten the total treatment duration. Irradiance of the electromagnetic radiation during the stabilisation phase S1' may be equal to irradiance ($E_2$) of the electromagnetic radiation at the start of the second exposure step S2.

The efficiency gain obtained during the two exposure steps S1-S2 can be partially lost (referred to as gain destabilisation) if the photovoltaic cells are kept for extended periods (several minutes) in the dark and at a high temperature (>100° C.). However, cooling of photovoltaic cells within a module is particularly slow due to the thermal inertia of the module.

In order to reduce the time spent above 100° C. and, more generally, the overall treatment time, the step S3 of cooling the group of photovoltaic cells is advantageously carried out under conditions such that the temperature T of the photovoltaic cells decreases at a rate greater than or equal to 1° C.·s$^{-1}$, preferably greater than or equal to 2° C.·s$^{-1}$. In other words, the aim is to cool the photovoltaic cells as quickly as possible.

To achieve this, an active cooling system can be used. As described previously, this cooling system can comprise a temperature-controlled support on which the module is disposed and/or an air blowing device (comprising nozzles, for example). The photovoltaic cells are then cooled by thermal conduction or forced convection.

The cooling step S3 has a third duration $d_3$ which can be between 5 s and 180 s, preferably between 10 s and 30 s.

In order to avoid a loss of efficiency (even partial), the group of photovoltaic cells is exposed to electromagnetic radiation during the cooling step S3, preferably at least until the temperature T of the photovoltaic cells becomes lower than 100° C. The electromagnetic radiation has a third irradiance $E_3$ of less than 1000 W/m$^2$ during the cooling step. In other words, cooling is advantageously carried out under residual illumination.

As described previously, the photovoltaic module treatment method is advantageously applied at the end of the lamination step, before laying a frame around the module (commonly referred to as a "laminate" at this stage of manufacture) and a junction box. Indeed, the frame (typically made of aluminium) can otherwise be subjected to high expansion stresses, which can lead to damage, for example breakage of the protective glass plate(s). The first exposure phase S1 is the most likely to affect mechanical properties of the module (thermal shock), especially if it is carried out on a module at room temperature. At the end of lamination, the module is still hot and thermal expansion stresses are thereby reduced.

The group of cells simultaneously exposed to electromagnetic radiation (steps S1-S2) and then simultaneously cooled (step S3) may encompass all the photovoltaic cells in the module. The treatment method of FIG. 3 or FIG. 4 is then carried out once per module.

On the contrary, depending on the dimensions of the photovoltaic module and the dimensions of the radiation source, it may be necessary to carry out the light-soaking treatment method several times in succession in order to treat the module entirely. Different groups of cells (belonging to the same module) will then be exposed to the electromagnetic radiation and then cooled. Advantageously, one group of cells is cooled while the next group of cells is exposed.

The photovoltaic cells in the module can be silicon heterojunction (SHJ) cells. A silicon heterojunction cell especially comprises a crystalline silicon substrate and at least one hydrogenated amorphous silicon passivation layer disposed on one face of the substrate.

Figure 1:
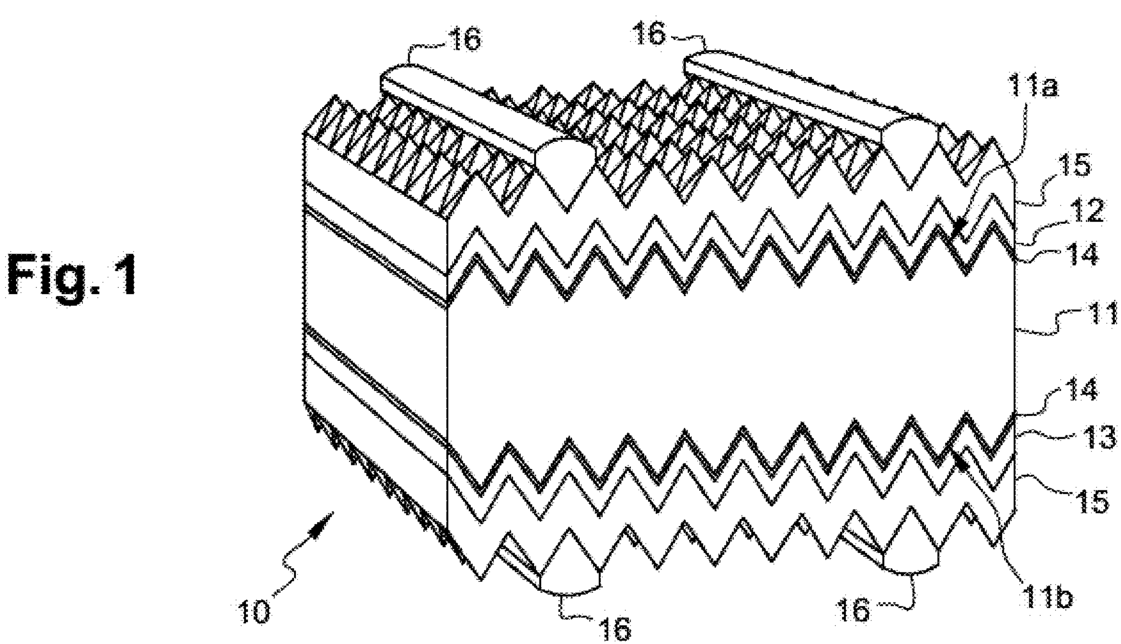
FIG. 1 is a schematic perspective view of one example of a heterojunction photovoltaic cell.

In one embodiment of the treatment method, each photovoltaic cell in the module is of the type represented in FIG. 1 and comprises:

- a substrate 11 made of n- or p-doped crystalline silicon;
- a first passivation layer 14 of hydrogenated (and preferably intrinsic) amorphous silicon disposed on the first face 11*a* of the substrate 11;
- a first amorphous silicon layer 12, disposed on the first passivation layer 14 and doped with a first type of conductivity;
- a first transparent conductive oxide layer 15 disposed on the first doped amorphous silicon layer 12;
- a second passivation layer 14 of hydrogenated (and preferably intrinsic) amorphous silicon disposed on the second face 11*b* of the substrate 11;
- a second amorphous silicon layer 13, disposed on the second passivation layer 14 and doped with a second type of conductivity opposite to the first type of conductivity; and
- a second transparent conductive oxide layer 15 disposed on the second amorphous silicon doped layer 13.

Such a silicon heterojunction photovoltaic cell architecture is described as asymmetrical because of the two amorphous silicon layers 12-13 doped with opposite types of conductivity and disposed on either side of the substrate 11. The amorphous silicon in the first doped layer 12 and/or the second doped layer 13 is preferably hydrogenated.

One of the amorphous silicon layers 12-13 is n-doped and constitutes an electron collecting layer, while the other of the amorphous silicon layers 12-13 is p-doped and forms a hole collecting layer. The doped amorphous silicon layers 12-13 can be replaced with n- and p-doped nanocrystalline silicon layers. Nanocrystalline silicon designates amorphous silicon containing silicon nanocrystals, the size of the nanocrystals being between 1 nm and 100 nm.

Alternatively, the photovoltaic cells of the module can be silicon Interdigitated Back Contacts-Heterojunction (or IBC-HET) cells or so-called "tandem" cells. A tandem cell comprises a silicon heterojunction sub-cell and a perovskite sub-cell.

One example of a photovoltaic module treatment method according to the invention will now be described. In this example, a first series of photovoltaic modules is exposed to electromagnetic radiation and then cooled as follows:

- first exposure step S1 (called the temperature rise step): irradiance $E_1$ equal to 48 kW/m$^2$ for a duration ($d_1$) equal to 12 s:
- second exposure step S2 (called the temperature maintenance step) divided into 6 constant irradiance steps, without cooling:
  - irradiance $E_2$ equal to 29 kW/m$^2$ for a duration equal to 4 s;
  - irradiance $E_2$ equal to 19 kW/m$^2$ for a duration equal to 13 s;
  - irradiance $E_2$ equal to 14.5 kW/m$^2$ for a duration equal to 12 s;
  - irradiance $E_2$ equal to 9.5 kW/m$^2$ for a duration equal to 20 s;
  - irradiance $E_2$ equal to 7 kW/m$^2$ for a duration equal to 40 s;
  - irradiance $E_2$ equal to 6 kW/m$^2$ for a duration equal to 139 s;
- cooling step S3 by means of air expelled through nozzles at a temperature of 20° C. and a pressure of 6 bar, with no residual illumination.

The total duration of the first and second exposure steps S1-S2 is therefore 240 s, that is 4 min. The target enhancement temperature is 150° C. The electromagnetic radiation has two distinct wavelengths: 950 nm (70% of the irradiance) and 450 nm (the remaining 30%). The photovoltaic modules are initially at room temperature (25° C.).

By way of comparison, a second series of photovoltaic modules (identical to those of the first series) is subjected to a conventional treatment method comprising a single exposure step lasting 7 minutes at an irradiance of 7 kW/m$^2$, and a cooling step identical to that of the example. The photovoltaic modules of the first and second series are constructed in the same way as the single-cell module described in connection with FIG. 2 (encapsulant, protective plates, type of cell, etc.). Each series comprises three modules.

Figure 5:
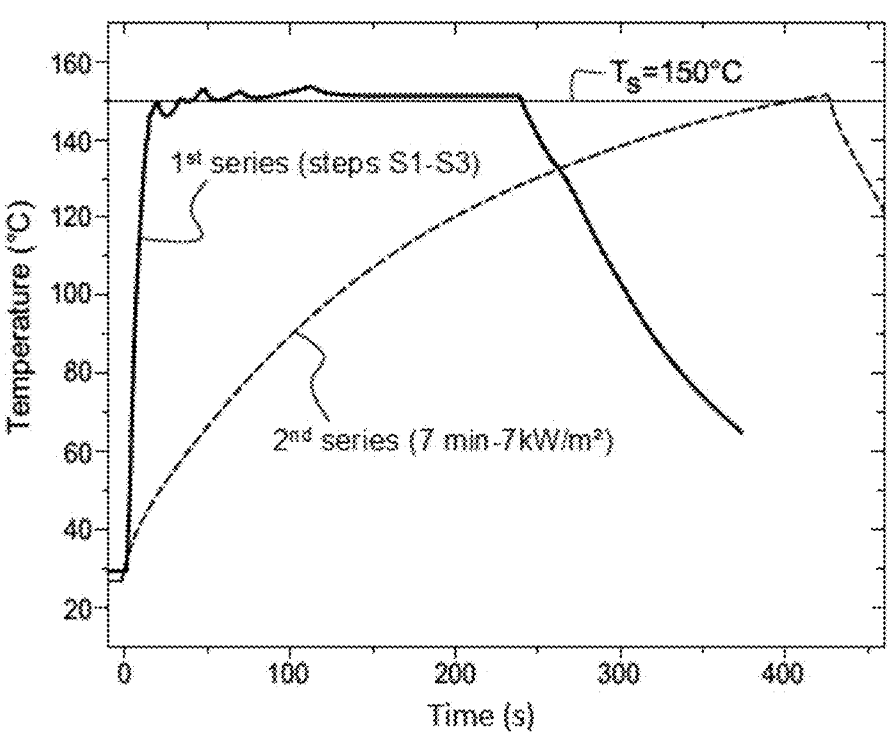
FIG. 5 represents the temperature of the photovoltaic cells of two photovoltaic modules, one having been subjected to one example of a treatment method according to the invention and the other having been subjected to a treatment method according to prior art.

FIG. 5 shows the temperature profiles T of a photovoltaic cell within a module of the first series (therefore subjected to steps S1-S3 of the method according to the invention) and of a photovoltaic cell within a module of the second series (conventional method at 7 kW/m$^2$ for 7 min). The temperature T is measured using a thermocouple placed between the photovoltaic cell and the encapsulant on the rear face (before the lamination step).

It is noticed that the enhancement temperature $T_s$ is reached much faster in the case of the first series of modules. Furthermore, in the temperature profile of the first series of modules, it is possible to clearly distinguish the temperature plateau $T \approx T_s$, corresponding to the second exposure step S2. In contrast, the temperature profile of the second series of modules is devoid of such a plateau.

Figure 6:
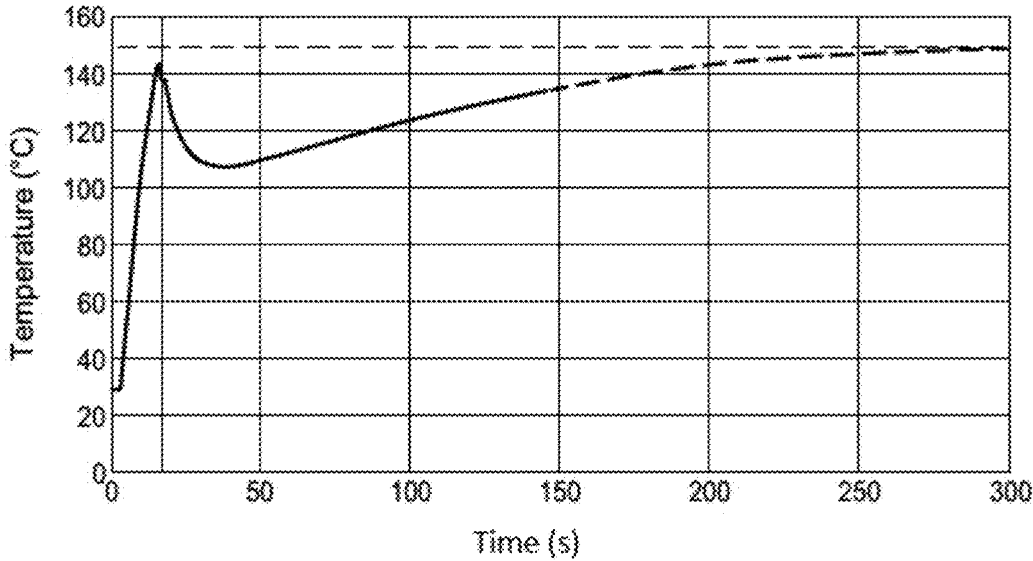
FIG. 6 illustrates temporary cooling of a photovoltaic module, when this module is exposed to electromagnetic radiation of moderate irradiance (6 $kW/m^2$) after an initial phase of exposure to high irradiance (48 $kW/m^2$)

FIG. 6 represents the temperature profile T of a photovoltaic cell within another module (but identical to those of the first and second series) when a constant irradiance equal to 6 kW/m$^2$ (i.e. that of the last step) is used during the second exposure phase S2. The irradiance value of 6 kW/m$^2$ corresponds to the value required to obtain a steady-state temperature T equal to 150° C. Due to the massive transport of heat from the cell to the encapsulating material and the protective plates (which are still relatively cold at the end of the first exposure step S1, depicted by the vertical line), the temperature T in the cell experiences a sharp decrease at the start of the second exposure step S2 before gradually rising towards the value of 150° C. But this drop in temperature means that the treatment is less effective and is therefore undesirable. This figure therefore illustrates the advantage of progressively lowering the irradiance (or progressively increasing the cooling effort), with the aim of maintaining the cell temperature around the target temperature (here $T_s$=150° C.).

Figure 7:
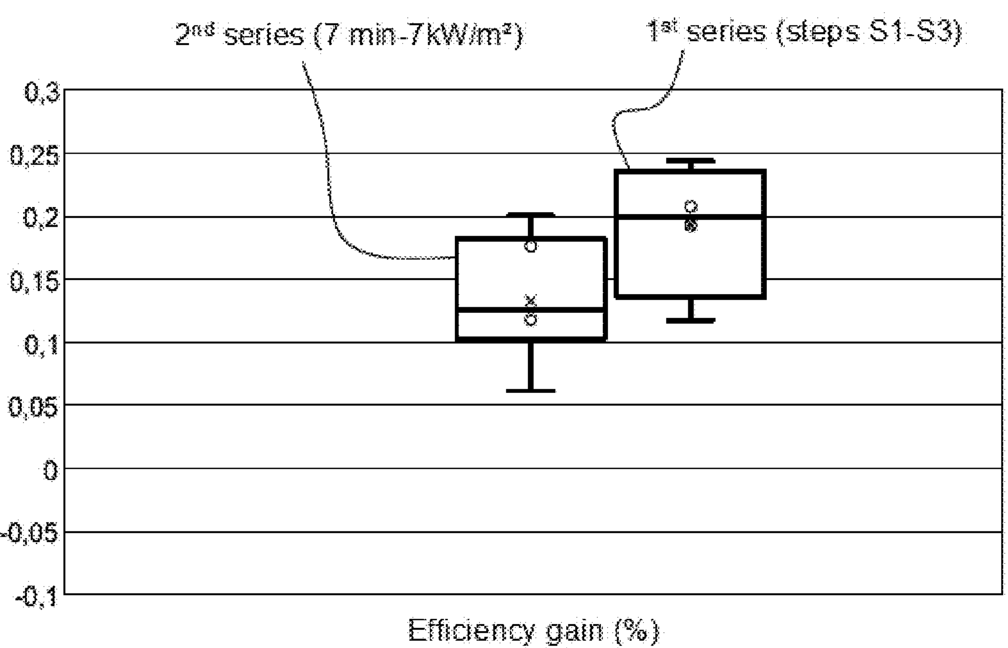
FIG. 7 represents photovoltaic cell efficiency gains achieved in the example of treatment method according to the invention and in the treatment method according to prior art.

FIG. 7 represents the efficiency gains obtained in the example of the treatment method according to the invention (1st series of modules) and those obtained by means of the conventional treatment method (2nd series of modules). Although the treatment method according to the invention is shorter (4 minutes versus 7 minutes), it provides (on average) greater efficiency gains.

Figure 8:
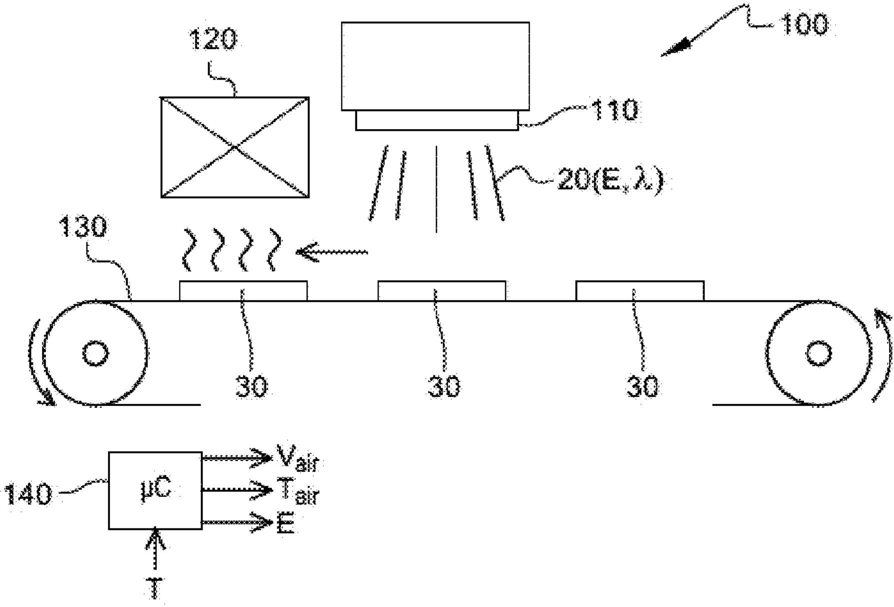
FIG. 8 represents a preferred embodiment of an equipment for implementing the treatment method according to the invention.

FIG. 8 represents a preferred embodiment of an equipment 1 for implementing the light-soaking treatment method of FIG. 3 or FIG. 4.

Equipment 100 comprises a magnetic radiation source 110 and a cooling system 120.

The radiation source 110 is configured (or programmed) to emit electromagnetic radiation 20 at least during the first and second exposure steps S1-S2, and advantageously during the cooling step S3 (cooling under residual illumination). It is dimensioned to illuminate at least one part of a photovoltaic module 30, and preferably an entire photovoltaic module 30.

The radiation source 110 may comprise an array of lasers or an array of light-emitting diodes (organic or not organic). Alternatively, it may comprise one or more lamps, for example of the halogen or xenon type. The radiation source 110 is equipped with a dimmer to vary irradiance of the electromagnetic radiation 20.

The cooling system 120 is configured to cool the photovoltaic module 30 during the cooling step S3, and potentially during the second exposure phase S2 (temperature maintenance phase). It may comprise one or more nozzles capable of blowing air towards the photovoltaic module 30. The cooling system 120 may especially comprise a first group of nozzles oriented in a first direction and a second group of nozzles oriented in a second direction different from the first direction. The nozzles of the first group are advantageously directed towards the location of the module when it is subjected to the second exposure step S2 (otherwise facing the radiation source 110). The nozzles of the second group are advantageously directed towards the location intended to carry out the cooling step S3.

Equipment 100 further comprises a support 130 configured to receive one or more photovoltaic modules 30 to be treated. The radiation source 110 is facing the support 130.

In this preferred embodiment, the support 130 is translationally movable relative to the radiation source 110 and capable of transporting several photovoltaic modules 30 simultaneously. The support 130 is, for example, a conveyor capable of moving the photovoltaic modules 30 past the radiation source 110 and, advantageously, at least one part of the cooling system 120. Thus, a first photovoltaic module 30 can be exposed to the electromagnetic radiation 20 (exposure steps S1-S2) while a second photovoltaic module 30 is cooled (cooling step S3) (see FIG. 8).

Alternatively, the photovoltaic modules 30 can be stopped one after the other at a station where all the steps S1-S3 are carried out with one module without moving it.

In addition, at least one part of the support 130 can be temperature-controlled (for example by integrating one or more metal plates in the conveyor belt) and thus contribute to cooling. This part of the support 130 can also be considered to be part of the cooling system 120.

Equipment 100 further comprises a control (or drive) circuit 140 for controlling the radiation source 110 and/or the cooling system 120. The control circuit 140 is advantageously configured (or programmed) to modulate irradiance of the electromagnetic radiation 20 as a function of temperature T of the photovoltaic cells within the module 30 being treated. It can also be configured to modulate one or more cooling parameters, such as temperature $T_{air}$ and speed $V_{air}$ of the air blown, as a function of temperature T of the photovoltaic cells. The control circuit 140 is, for example, a microcontroller.

The radiation source 110 and/or the cooling system 120 are advantageously controlled according to temperature T of the photovoltaic cells by means of a control loop (comprising, for example, a PID controller).

Advantageously, equipment 100 comprises a sensor for the temperature T of the photovoltaic cells, for example in the form of a pyrometer. This sensor communicates with the control circuit 140 in order to deliver the temperature measurement thereto.

One alternative for controlling the radiation source 110 or the cooling system 120 consists in monitoring an irradiance profile and/or at least one cooling parameter profile (air speed, air temperature, etc.) previously set up by means of a reference photovoltaic module (test module) into which a thermocouple (or any other temperature sensor) has been intentionally introduced and placed in contact with the photovoltaic cells. Advantageously, the profile or profiles are recorded in a memory of the control circuit 140.

The invention claimed is:

1. A method for treating a photovoltaic module comprising a plurality of photovoltaic cells coated with an encapsulating material and disposed between two protective plates, said method successively comprising:

- a first step of exposing at least one photovoltaic cell of the photovoltaic module to electromagnetic radiation, during which the temperature of said at least one photovoltaic cell increases until it reaches a temperature referred to as the efficiency enhancement temperature, greater than or equal to 100° C.;
- a second step of exposing said at least one photovoltaic cell to electromagnetic radiation, during which the temperature of said at least one photovoltaic cell is maintained between $T_s$−5° C. and $T_s$+5° C. where $T_s$ is the efficiency enhancement temperature, the second exposure step having a duration greater than or equal to 5 s; and
- a step of cooling said at least one photovoltaic cell until it reaches a temperature below 100° C.;
- wherein the electromagnetic radiation has a first irradiance during the first exposure step and a second irradiance during the second exposure step, the second irradiance being lower than the first irradiance, and wherein the second irradiance is decreased in the second exposure step.

2. The method according to claim 1, wherein the first exposure step is carried out under conditions such that the temperature of said at least one photovoltaic cell increases at a rate greater than or equal to 1° $C.\cdot s^{-1}$.

3. The method according to claim 1, wherein said at least one photovoltaic cell is cooled during the cooling step by thermal conduction by means of a temperature-controlled support or by forced convection.

4. The method according to claim 1, wherein the cooling step is carried out under conditions such that the temperature of said at least one photovoltaic cell decreases at a rate greater than or equal to 1° $C.\cdot s^{-1}$.

5. The method according to claim 1, wherein said at least one photovoltaic cell is exposed to electromagnetic radiation during the cooling step, the electromagnetic radiation having an irradiance of less than 1000 $W/m^2$ during the cooling step.

6. The method according to claim 1, wherein the first irradiance is greater than or equal to 3 $kW/m^2$.

7. The method according to claim 1, wherein the first irradiance is constant.

8. The method according to claim 1, wherein the second irradiance is decreased during the second exposure step in steps.

9. The method according to claim 1, wherein several photovoltaic cells of the photovoltaic module are simultaneously exposed in the first and second exposure steps, and then simultaneously cooled in the cooling step.

10. The method according to claim 1, wherein the second exposure step is immediately consecutive to the first exposure step.

11. An equipment for the treatment of a photovoltaic module by light-soaking, comprising an electromagnetic radiation source, a cooling system and means configured to implement a treatment method according to claim 1.

12. The equipment according to claim 11, further comprising a support translationally movable relative to the radiation source and configured to transport several photovoltaic modules simultaneously.

13. The equipment according to claim 11, further comprising a control circuit configured to modulate at least one parameter of the cooling system and/or irradiance of the electromagnetic radiation as a function of the temperature of said at least one photovoltaic cell.

14. The equipment according to claim 11, further comprising a control circuit configured to modulate at least one parameter of the cooling system and/or irradiance of the electromagnetic radiation as a function of a predetermined profile.

15. The equipment according to claim 11, wherein the cooling system comprises a plurality of nozzles capable of blowing air towards the photovoltaic module, the plurality of nozzles comprising a first group of nozzles oriented in a first direction and a second group of nozzles oriented in a second direction different from the first direction, the nozzles of the first group being directed towards a location of the photovoltaic module intended to carry out the second exposure step and the nozzles of the second group being directed towards a location of the photovoltaic module intended to carry out the cooling step.

16. The equipment according to claim 11, wherein the radiation source is dimensioned to irradiate the photovoltaic module entirely.

17. The method according to claim 1, wherein the second exposure step has a duration greater than or equal to 10 s.

18. The method according to claim 2, wherein the first exposure step is carried out under conditions such that the temperature of said at least one photovoltaic cell increases at a rate greater than or equal to 2° $C.\cdot s^{-1}$.

19. The method according to claim 4, wherein the cooling step is carried out under conditions such that the temperature of said at least one photovoltaic cell decreases at a rate greater than or equal to 2° $C.\cdot s^{-1}$.

20. The method according to claim 6, wherein the first irradiance is greater than or equal to 10 $kW/m^2$.

* * * * *